United States Patent [19]

Ylilammi

[11] Patent Number: 6,051,907

[45] Date of Patent: Apr. 18, 2000

[54] METHOD FOR PERFORMING ON-WAFER TUNING OF THIN FILM BULK ACOUSTIC WAVE RESONATORS (FBARS)

[75] Inventor: Markku Antero Ylilammi, Espoo, Finland

[73] Assignee: Nokia Mobile Phones Limited, Salo, Finland

[21] Appl. No.: 08/728,568

[22] Filed: Oct. 10, 1996

[51] Int. Cl.[7] .................................................. H01L 41/08
[52] U.S. Cl. ........................... 310/312; 310/324; 310/366
[58] Field of Search ..................................... 310/311, 312, 310/324, 366

[56] References Cited

U.S. PATENT DOCUMENTS

| | | | |
|---|---|---|---|
| 3,173,100 | 3/1965 | White | 330/35 |
| 3,293,557 | 12/1966 | Denton | 330/4.6 |
| 3,486,046 | 12/1969 | Zalar | 310/324 |
| 3,686,579 | 8/1972 | Everett | 330/5.5 |
| 3,696,312 | 10/1972 | Kuhn et al. | 333/24 R |
| 3,760,471 | 9/1973 | Borner | 310/312 X |
| 3,764,928 | 10/1973 | Gires et al. | 330/5.5 |
| 3,916,490 | 11/1975 | Sheahan et al. | 310/312 X |
| 3,924,312 | 12/1975 | Coussot et al. | 310/312 X |
| 4,019,181 | 4/1977 | Olsson et al. | 343/6.555 |
| 4,320,365 | 3/1982 | Black et al. | 310/324 X |
| 4,365,216 | 12/1982 | Minagawa et al. | 333/153 |
| 4,418,299 | 11/1983 | Momosaki | 310/312 X |
| 4,456,850 | 6/1984 | Inoue et al. | 310/324 |
| 4,502,932 | 3/1985 | Kline et al. | 204/192 EC |

(List continued on next page.)

FOREIGN PATENT DOCUMENTS 0609555 8/1994 European Pat. Off. .

OTHER PUBLICATIONS

"A monolithic piezoelectric amplitude modulator" Bransalov et al., International Journal of Electronics, vol. 47, No. 6, Dec. 1979, pp. 545–553.

"Ultralinear small–angle phase modulator", Symposium on Frequency Control, 1991, pp. 645–648, Forty–Fifth Anual Symposium on Frequency Control, J. Lowe and F. L. Walls.

Lakin, K. M. et al., "Thin Film Bulk Acoustic Wave Filters for GPS"IEEE 1992, pp. 471–476.

Driscoll M.J. et al., Recent Advances In monolithic Film Resonator Technology IEEE 1986, pp. 365–369.

"Acoustic Bulk Wave Composite Resonators", K. Lakin, Appl. Phys. Lett. 38(3), 1 Feb. 1981, pp. 125–127.

"Systematic Design of Stacked–Crystal Filters by Microwave Network Methods", A. Ballato, IEEE Trans. of Microwave Theory and Techniques, vol., MTT–22, No. 1, Jan., 1974, pp. 14–25.

"Multi–Layered Ultrasonic Transducers Employing Air–Gap Structure", S. Yoshimoto, IEEE Trans. of Ultrasonic . . . , vol. 42, No. 3, May, 1995, pp. 339–343.

"Design of Unapodized Surface–Wave Transducers with Spectral Weighting", G. Nudd, IEE Trans. on Microwave Theory and Techniques, vol. MTT–22, No. 1, Jan., 1974, pp. 14–23.

(List continued on next page.)

*Primary Examiner*—Mark O. Budd
*Attorney, Agent, or Firm*—Perman & Green, LLP

[57] ABSTRACT

A method for tuning a Thin Film Bulk Acoustic Wave Resonator (FBAR) located on a wafer. The FBAR comprises a plurality of layers having respective thicknesses. The FBAR exhibits at least one of a series resonance and a parallel resonance at respective frequencies that are a function of the thickness of at least one of the layers. A first step of the method includes measuring a frequency at which the FBAR exhibits one of a series resonance and a parallel resonance. A next step includes calculating an amount (A) by which the thickness of the at least one layer needs to be altered in order to minimize a difference between the measured frequency and a reference frequency. A further step includes altering the thickness of the at least one layer by the amount (A).

11 Claims, 8 Drawing Sheets

U.S. PATENT DOCUMENTS

| | | | |
|---|---|---|---|
| 4,556,812 | 12/1985 | Kline et al. | 310/324 |
| 4,562,370 | 12/1985 | Von Dach | 310/312 |
| 4,642,508 | 2/1987 | Suzuki et al. | 310/321 |
| 4,897,618 | 1/1990 | Svetanoff | 331/76 |
| 5,153,476 | 10/1992 | Kosinski | 310/313 R |
| 5,162,691 | 11/1992 | Mariani et al. | 310/321 |
| 5,166,646 | 11/1992 | Avanic et al. | 331/107 A |
| 5,185,589 | 2/1993 | Krishnaswamy et al. | 333/133 |
| 5,233,259 | 8/1993 | Krishnaswamy et al. | 310/324 |
| 5,332,943 | 7/1994 | Bhardwaj | 310/326 |
| 5,382,930 | 1/1995 | Stokes et al. | 333/191 |
| 5,446,306 | 8/1995 | Stokes et al. | 257/416 |
| 5,587,620 | 12/1996 | Ruby et al. | 310/312 X |
| 5,596,239 | 1/1997 | Dydyk | 310/311 |
| 5,629,906 | 5/1997 | Sudol et al. | 367/162 |

OTHER PUBLICATIONS

"Development of Miniature Filters for Wireless Applications", K. Lakin et al., IEEE MTT–S Digest, 1995, pp. 883–886.

"Temperature Compensated High Couplijng and High . . . Substrates", T. Shiosaki et al., Ultrasonic Symposium, 1984, pp. 405–410.

"An Air–Gap Type Piezoelectric Composite Thin Film Resonator", H. Satoh et al., IEEE, 1985, pp. 361–366.

"Coplanar Waveguides and Microwave Inductors on Silicon Substrates", A. Reyes, IEEE, 1995, pp. 2016–2021.

"Ultrasonic in Integrated Electronics", W. Newell, Proceedings of the IEEE, pp. 1305–1309.

METHOD FOR PERFORMING ON-WAFER TUNING OF THIN FILM BULK ACOUSTIC WAVE RESONATORS (FBARS)

FIELD OF THE INVENTION

This invention relates to Thin Film Bulk Acoustic Wave Resonators (FBARs) and, in particular, this invention relates to a method for tuning series and parallel resonant frequencies of FBARs constructed on wafers.

BACKGROUND OF THE INVENTION

Thin Film Bulk Acoustic Resonators (FBARs) are preferably fabricated to comprise layers having thicknesses that are within an acceptable range of so called "design" or nominal thicknesses. In this manner, when the FBARs are operated, they will exhibit series and parallel resonant frequencies (also collectively referred to as "resonant frequencies") which are within an acceptable error margin (e.g., within ±1%) of design or "target" series and parallel resonant frequencies, respectively. Due to the fact that thin-film layers which form FBARs are not always reproducible, however, these layers may not always be formed to have precise design thicknesses. As a result, for a case in which, by example, a plurality of FBARs are fabricated, some of these FBARs may exhibit resonant frequencies that are beyond an acceptable error margin of the target resonant frequencies.

High-quality production environments have been known to produce wafers having FBARs which exhibit series and parallel resonant frequencies ranging within ±1% of those yielded by other FBARs fabricated on a same wafer. However, FBARs fabricated on one wafer may not always exhibit resonant frequencies that are within this range of resonant frequencies yielded by FBARs formed on other wafers. By example, for a case in which there is a 3% variation in the thin film layer thicknesses of FBARs of a number of separate wafers, and wherein each FBAR comprises five layers, there can be a 7% variation in the resonant frequencies of these devices. As a consequence of this variation of resonant frequencies, a number of the wafers may have FBARs which yield resonant frequencies that are beyond the acceptable tolerance of the design resonant frequencies. By example, in a case wherein there is a standard deviation of 3% in the resonant frequencies yielded by FBARs from a number of different wafers, only 36% of the wafers may have FBARs yielding resonant frequencies ranging within ±1% of design resonant frequencies. Unfortunately, these disparities typically do not become apparent until after the FBARs have been separated from the wafer and their resonant frequencies have been measured.

In view of these problems, it can be appreciated that it is desirable to provide a technique which may be performed on FBARs after they have been formed on wafers, and which can be used to adjust or "tune" resonant frequencies exhibited by the FBARs in a manner that minimizes a disparity between the exhibited resonant frequencies and corresponding design resonant frequencies.

One known technique which attempts to tune resonant frequencies yielded by quartz crystal devices involves depositing a metal such as gold through a mechanical mask over selected portions of the devices. Unfortunately, this technique requires a photolithography step which would be difficult and expensive to perform on FBARs having bridge structures.

Thus, it is also desirable to provide a method for tuning resonant frequencies exhibited by FBARs that is inexpensive and simple to perform.

OBJECTS OF THE INVENTION

It is one object of this invention to provide a simple and inexpensive method for tuning a resonant frequency exhibited by Thin Film Bulk Acoustic Wave Resonators (FBARs) to minimize a disparity between the exhibited resonant frequency and a respective design resonant frequency.

Further objects and advantages of this invention will become apparent from a consideration of the drawings and ensuing description.

SUMMARY OF THE INVENTION

The foregoing and other problems are overcome and the objects of the invention are realized by a method for tuning a Thin Film Bulk Acoustic Wave Resonator (FBAR) on a wafer.

The FBAR comprises a plurality of layers having respective thicknesses, and exhibits at least one of a series resonance and a parallel resonance at respective frequencies that are a function of the thickness of at least one of the layers. The method includes a first step of measuring a frequency at which the FBAR exhibits one of a series resonance and a parallel resonance. A next step includes calculating an amount (A) by which the thickness of the at least one layer needs to be altered in order to minimize a difference between the measured frequency and a so called "design" or reference frequency.

A next step includes altering the thickness of the at least one layer by the amount (A). Preferably, this step is performed to remove material from the layer. Although tuning can be achieved by adding material, the addition of material to the layer may cause a short-circuit within the FBAR, therefore requiring an extra step of removing a portion of the added material in order to eliminate the short-circuit.

As a result of the step of altering the thickness of the at least one layer, the difference between the measured frequency and the reference frequency is minimized.

In accordance with the invention, the at least one layer is one of a top electrode and a membrane layer. For a case in which the at least one layer is the top electrode, the step of altering is performed by etching the top electrode in, by example, one of fluorine plasma or chlorine plasma.

For a case in which there are a plurality of FBARs constructed on a wafer, the step of measuring described above is performed by measuring frequencies at which selected ones of the FBARs exhibit one of a series resonance and a parallel resonance. An average of the measured frequencies is then calculated. A next step includes calculating an amount (A) by which the thickness of the at least one layer of each selected FBAR needs to be altered in order to minimize a difference between the calculated average of the measured frequencies and a reference frequency.

Thereafter, the at least one layer thickness of each of the plurality of FBARs is altered by the amount (A). In this manner, the plurality of FBARs may be tuned on the wafer. A further step includes cutting or dicing the wafer into individual FBAR chips.

In addition to applying the method of the invention to FBARs of a single wafer, the method may be performed in cases wherein there are a plurality of wafers. For this case, the steps described above may be performed to tune the FBARs of each wafer. In this manner, each of the wafers can be tuned individually so that its respective FBARs exhibit resonant frequencies ranging within a ±1% error margin of the design resonant frequency.

Figure 11:
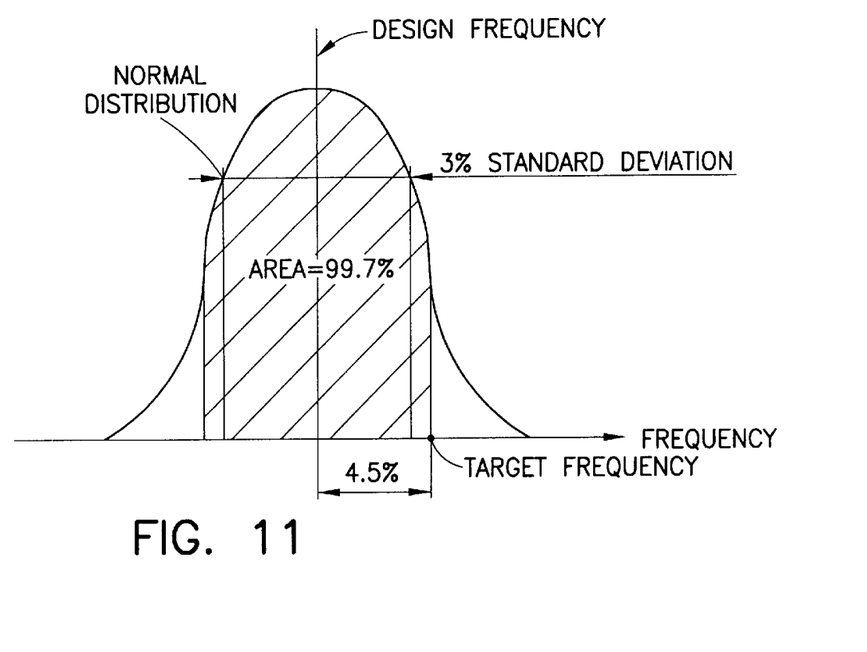
FIG. 11 is a standard deviation curve for an exemplary case in which the method of the invention is employed.

In an exemplary case in which there is a 3% standard deviation in the series resonant frequencies exhibited by FBARs of the plurality of wafers, as many as 99.7% of the wafers can be tuned successfully by designing the FBARs to yield resonant frequencies that are 4.5% below a target resonant frequency. A standard deviation curve for this exemplary case is shown in FIG. 11.

According to another aspect of the invention, the tuning of FBARs may be accomplished by the addition of a layer of a dielectric material to a portion of the respective FBARs. After the dielectric material is deposited over the FBARs, portions of the material may be covering contact pads of the electrodes. In this event, these portions of the deposited material are removed in order to allow wires to be bonded to the contact pads.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

The fabrication of Thin Film Bulk Acoustic Wave Resonators (hereinafter referred to as "FBARs") on wafers may not always produce FBARs which yield actual parallel and series resonant frequencies (also collectively referred to as "resonant frequencies") that are within an acceptable error margin (e.g., within 1%) of nominal or so called "design" resonant frequencies. Being that the thicknesses of layers forming FBARs and the types of materials forming these layers at least partially influence the frequencies at which the FBARs resonate, the disparity between the design and actual resonant frequencies can be a consequence of an associated disparity between design and actual layer thicknesses of the FBARs.

The inventor has recognized that by altering the structure of individual FBARs formed on wafers, and before dicing the wafer, the FBARs can be "tuned" so that they exhibit a series or parallel resonant frequency that is within an acceptable error margin (e.g., within 1%) of a design series or parallel resonant frequency, respectively. As such, the inventor has developed an inexpensive method for performing such tuning.

According to a preferred method of the invention, the FBARs are tuned by reducing the thicknesses of a top electrode layer of individual ones of the FBARs. The method may be understood in view of FIGS. 1 and 2, which illustrate a flow diagram of the method and a cross-section of an exemplary FBAR 19 having design or reference dimensions, respectively. The method includes a number of steps, which will be described below. The FBAR 19 comprises a top electrode 28, a bottom electrode 24, a piezoelectric layer 26, and a bridge or "membrane" layer 22 constructed on a wafer 20. For the purposes of this description, the FBAR 19 is designated as a "design reference FBAR", and represents a design or model version of an FBAR based upon which actual FBARs are fabricated. For an exemplary case, it is assumed that the FBAR 19 is designed so that: (a) the top and bottom electrodes 24 and 28, respectively, each comprise Molybdenum (Mo) having a thickness of 300 nm; (b) the piezoelectric layer 26 comprises zinc-oxide (ZnO) having a thickness of 2060 nm; and (c) the bridge layer 22 comprises silicon-dioxide ($SiO_2$) having a thickness of 400 nm. It is also assumed that the FBAR 19 is designed to have a series resonance at a frequency of 954.6 MHz.

Figure 1:
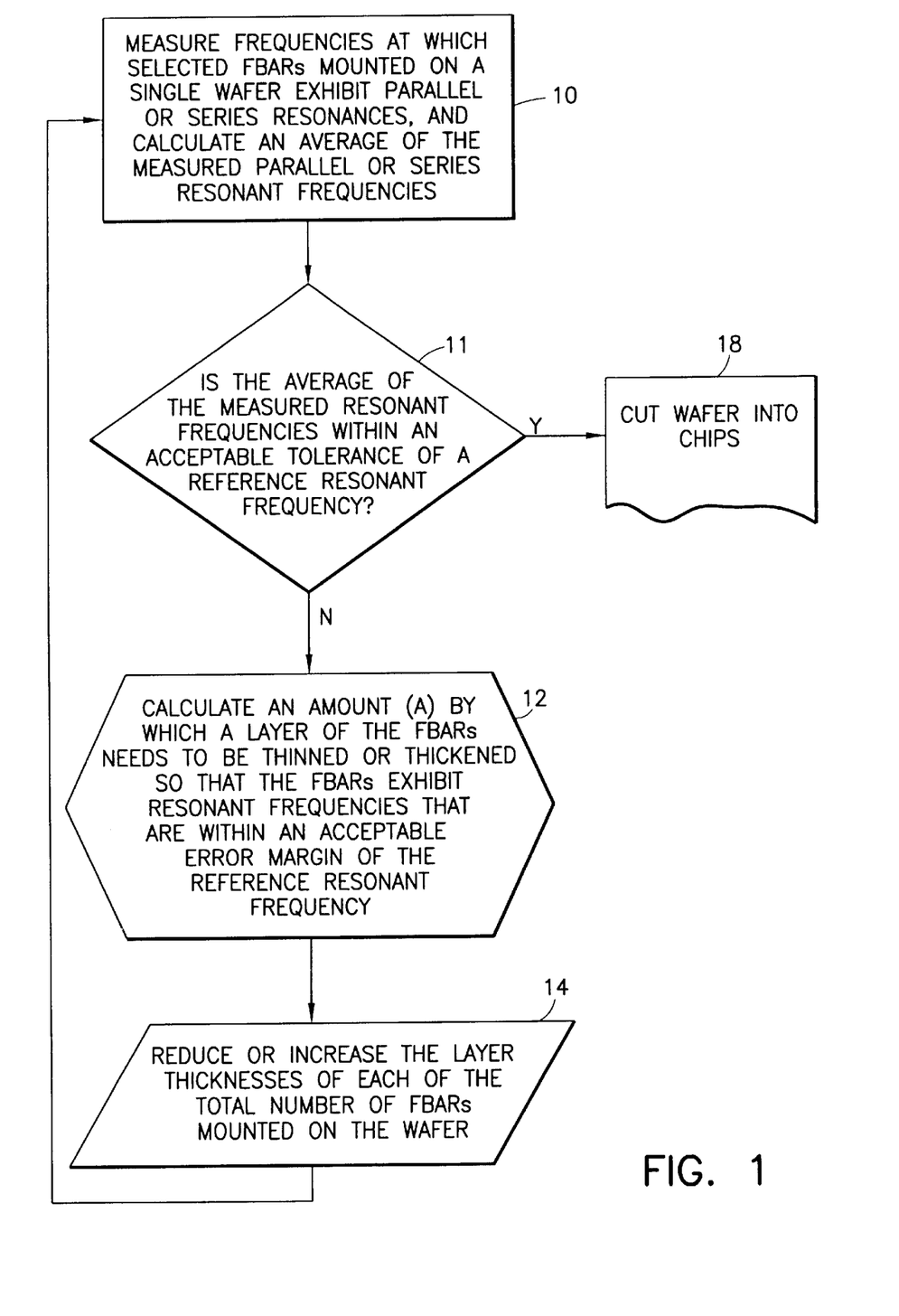
FIG. 1 illustrates a flow diagram of a method performed in accordance with the invention for tuning at least one of a series resonant frequency and a parallel resonant frequency exhibited by Thin Film Bulk Acoustic Wave Resonators (FBARs) constructed on a wafer.
Figure 2:
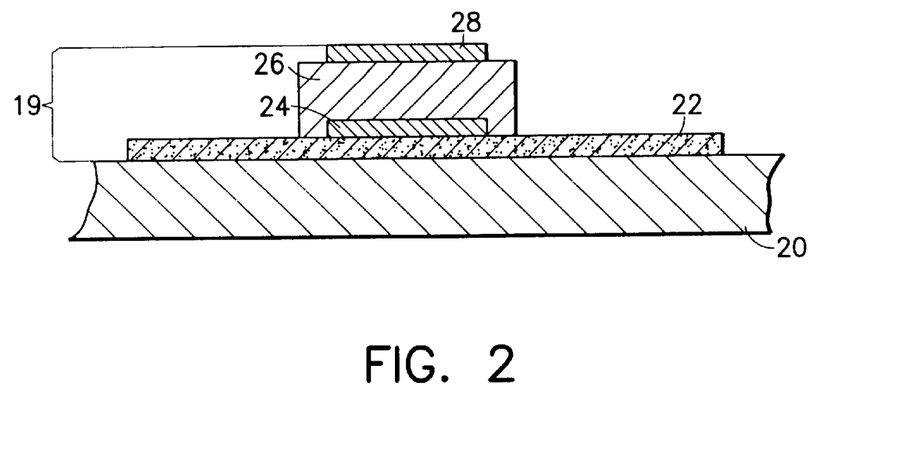
FIG. 2 illustrates a cross-section of an exemplary "design" FBAR formed on a wafer, wherein the FBAR comprises layers with nominal or design thicknesses.

A first step of the process is designated by Block 10 in FIG. 1. For this step, sample measurements are taken of a selected number of FBARs fabricated on a single wafer to determine the frequencies at which the selected FBARs exhibit one of a series resonance and a parallel resonance. The number and locations of FBARs selected may be randomly selected, or may be based on upon some predefined criterion, as long as a sufficient number of measurements are taken to obtain a representative average of the measured frequencies, as will be described below. The measurements may be performed in any suitable manner. For example, each of the selected FBARs may be connected to a wafer prober coupled to a device for measuring the frequency response of the FBAR in response to an applied signal. The frequency of the applied signal is varied as needed until the FBAR exhibits its characteristic series or parallel resonance. For the purposes of this description, it is assumed that this step is performed to measure the series resonant frequency of the selected FBARs.

Figure 7:
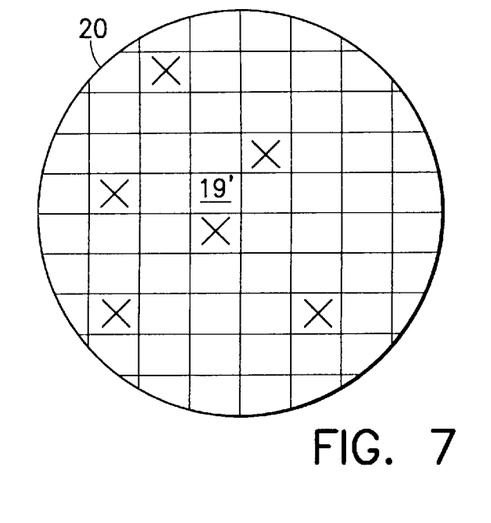
FIG. 7 illustrates an exemplary wafer having a plurality of FBARs formed thereon.

FIG. 7 illustrates an exemplary wafer 20 prior to being diced. A plurality of FBARs are fabricated on the wafer 20. Each of the FBARs is designated as a square in FIG. 7. A representative one of the FBARs is labeled "19'". The FBARs identified with "x" represent the FBARs selected to be measured.

Based upon the measured series resonant frequencies exhibited by the selected FBARs, an average of these frequencies is then calculated. Being that FBARs located on a single wafer typically exhibit resonant frequencies that are within 1% of those of other FBARs located on the wafer, the calculated average may be considered to be representative of the series resonant frequency of each of the FBARs located on the wafer.

Figure 3A:
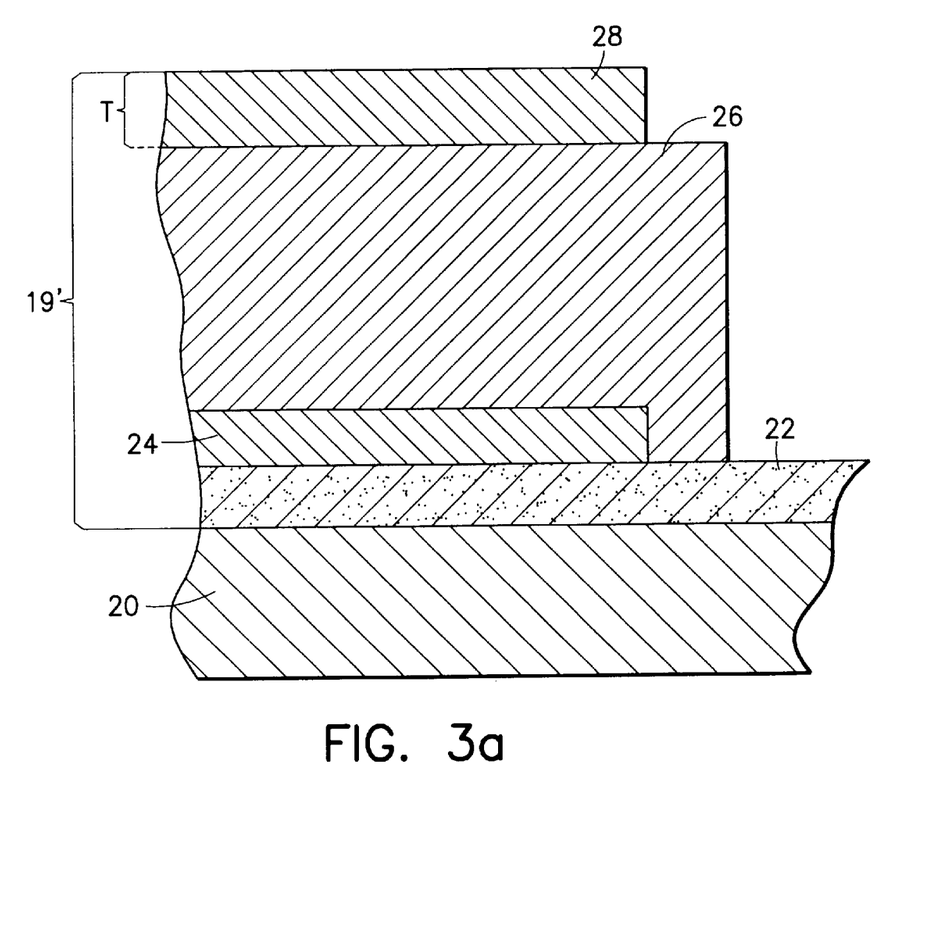
FIG. 3a illustrates a cross-section of a portion of an exemplary FBAR constructed on a wafer, showing a thickness T of a top electrode layer.

FIG. 3a illustrates FBAR 19' constructed on a portion of the wafer 20. For the purposes of this description, the FBAR 19' is deemed to represent an FBAR that yields the calculated average series resonant frequency. Also for the purposes of this description, FBAR 19' is designated as an "actual representative FBAR 19'". FBAR 19' comprises similar elements as the design representative FBAR 19 of FIG. 2, except that the layers forming FBAR 19' are deemed to have different thicknesses that those of FBAR 19 owing to, by example, inaccurate layer formations made during the fabrication process of the FBAR 19'. FIG. 3a also shows a top electrode 28 of the actual representative FBAR 19' having a thickness of T.

For a next step, which is designated by Block 11, it is determined if the calculated average series resonant frequency is within an acceptable error margin (e.g., within ±1%) of the design series resonant frequency (also referred to in FIG. 1 as a "reference resonant frequency") (e.g., 954.6 MHz). If the calculated average series resonant frequency is within the acceptable error margin of the design series resonant frequency, the wafer may then be cut into chips (Block 18), and no further steps need to be performed.

In an exemplary case, however, it is assumed that the calculated average resonant frequency is approximately 917 MHz, which is not within the acceptable error margin (within ±1%) of the design series resonant frequency of 954.6 MHz. As such, it can be concluded that at least a substantial number of the FBARs located on the wafer comprise layers having thicknesses that are not within an acceptable tolerance of the design thicknesses. Thus, further steps of the process designated by Blocks 12 and 14 may then be performed.

Figure 5:
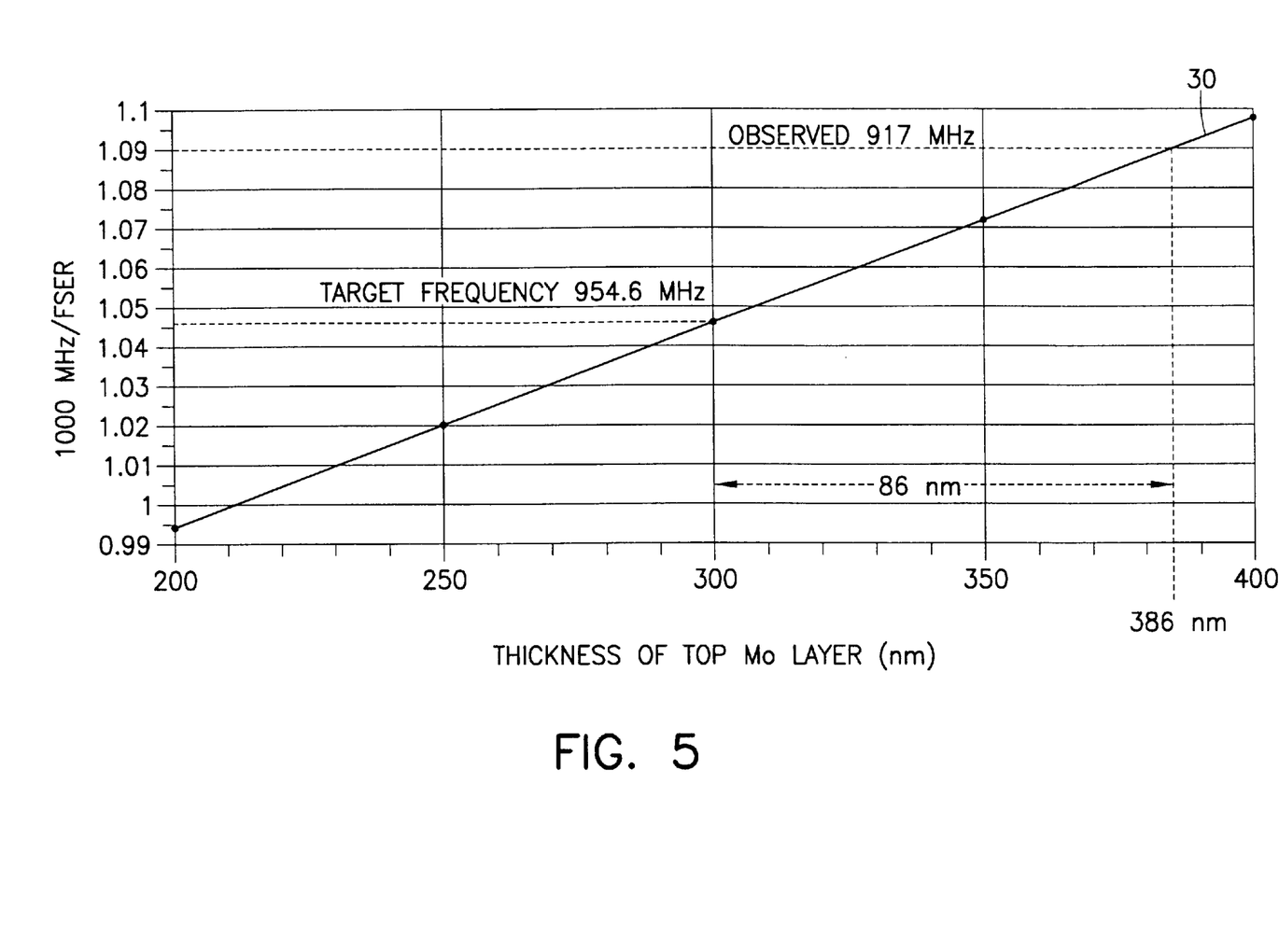
FIG. 5 illustrates a graph showing a relationship between thicknesses of an FBAR top electrode and series resonant frequencies exhibited by the FBAR.

The step designated by Block 12 may be understood in consideration of FIG. 5, which illustrates a graph showing the manner in which series resonant frequencies exhibited by an FBAR are related to various thicknesses of a top electrode of the FBAR. As can be seen from the graph, the inverse of each particular series resonant frequency is a function of a corresponding particular thickness of the top electrode. The relationship is practically a linear one and is indicated by the line labelled "30". It should be noted that modeling with respect to device layer thicknesses may be performed using any suitable technique, including that disclosed in an article entitled "Systematic Design of Stacked-Crystal Filters by Microwave Network Methods", IEEE Trans. Microwave Theory Tech., vol. MTT-22, pp. 14–25, January 1974, by Arthur Ballato, Henry L. Bertoni, and Theodor Tamir.

The relationship shown in FIG. 5 is used to determine an amount (also referred to as "amount (A)") of material needed to be removed from the top electrodes of the FBARs on the wafer in order to tune their series resonant frequencies to be within the acceptable error margin (e.g., within ±1%) of the design series resonant frequency. This is accomplished in the following manner. Using the calculated average series resonant frequency of 917 MHz, the top electrode thickness which corresponds to this frequency is interpolated from the linear relationship shown in FIG. 5. By example, it can be seen that the resonant frequency of 917 MHz occurs when the top electrode has a thickness of approximately 386 nm. It can also be appreciated from FIG. 5 that in order to achieve a series resonant frequency that is equal to the design or "target" series resonant frequency of 954.6 MHz, the thickness of the top electrode needs to be reduced by 86 nm to a thickness of approximately 300 nm. An actual calculation performed assuming this reduction in thickness resulted in a resonant frequency of 957.42 MHz, which is 0.29% (i.e., less than 1%) above the target frequency. It should be noted that this step may be performed by any suitable means such as, by example, a computer program.

Figure 3B:
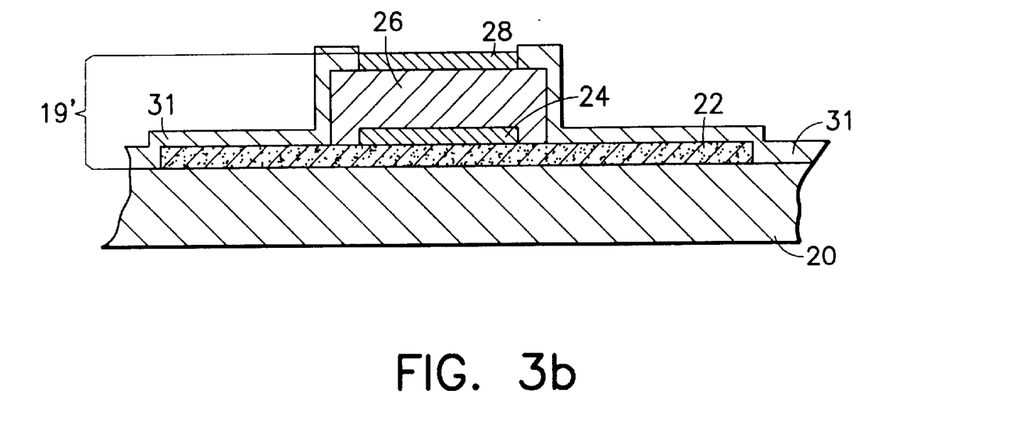
FIG. 3b illustrates an exemplary FBAR formed on a wafer, wherein the FBAR comprises a thin film protective layer.

A next step of the process is designated by Block 14 of FIG. 1. During this step, material is removed from the top electrodes of each FBAR on the wafer by, for example, dry etching using fluorine plasma (hereinafter referred to as "F plasma"), as will be described below. Prior to the performance of this step, portions of the FBARs and of the wafer which are not to be etched may be protected so that they will not be affected by the etching process. By example, a material which is passive in F plasma may be sputtered over the areas of the FBARs and over the areas of the wafer that are not to be etched. The material, which may comprise, by example, Aluminum Nitride (AlN), Aluminum (Al), or Zinc-Oxide (ZnO), is then patterned appropriately to form a protective thin-film layer 31 (FIG. 3b).

Figure 4:
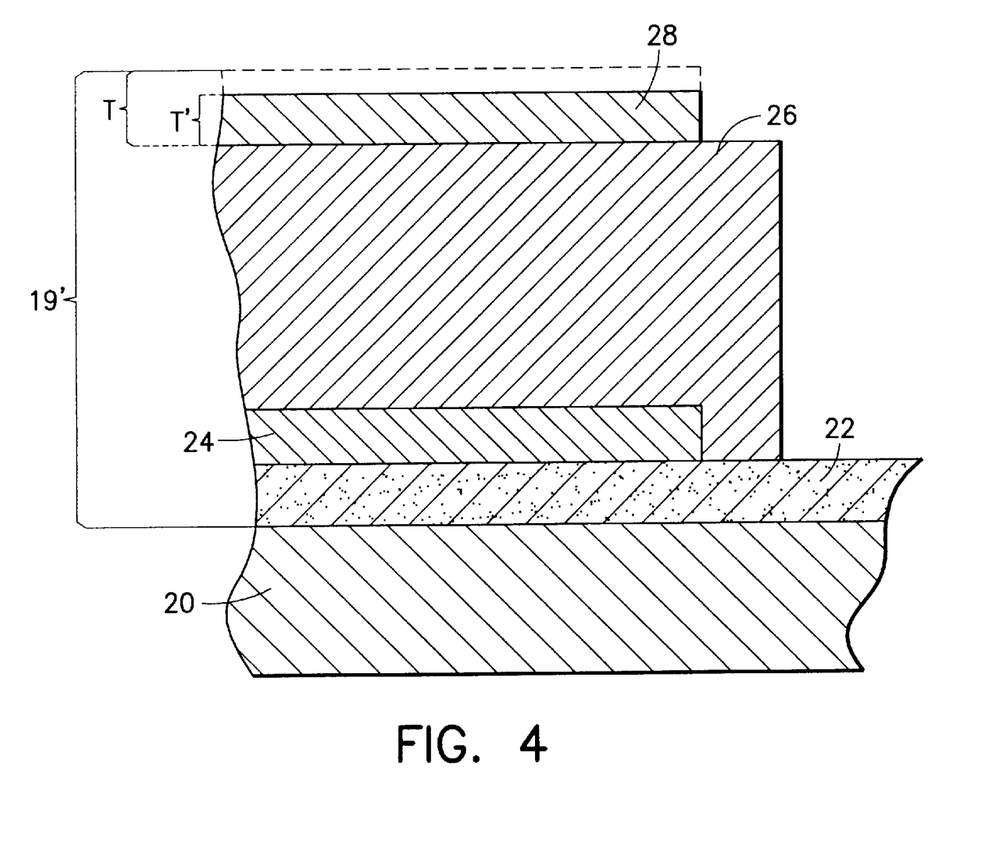
FIG. 4 illustrates the FBAR and wafer of FIG. 3a after having undergone the method of FIG. 1.

Thereafter, the top electrode of each individual FBAR on the wafer is etched in, for example, F plasma, to reduce the top electrode thickness by the amount (A) (e.g., 86 nm) calculated in the step designated by Block 12. FIG. 4 illustrates an example of the actual representative FBAR 19' after having its top electrode thickness T reduced by the amount (A) to a thickness of T'.

Because FBARs located on a common wafer typically exhibit resonant frequencies that are within 1% of those of other FBARs located on the wafer, the reduction of the top electrode thicknesses of the FBARs (based upon the calculated average of the series resonant frequencies) causes the respective FBARs to yield series resonant frequencies that are substantially equal to the design series resonant frequency, and which are at least within a ±1% error margin of the design series resonant frequency. In this manner, each of the FBARs on the wafer is tuned simultaneously. For the purposes of this description, a wafer having tuned FBARs is designated as a "tuned wafer".

The results of the top electrode thickness reduction may be verified by re-measuring the series resonant frequencies of a selected number of the FBARs (Block 10), and thereafter calculating an average of these measured frequencies in a similar manner as described above. For a case in which it is determined that the calculated average of the re-measured series resonant frequencies is within the acceptable error margin of the target series resonant frequency (Block 11), then no more dry etching needs to be performed to reduce the top electrode thicknesses, and the wafer may then be cut into chips (Block 18). For a case in which it is determined that the calculated average of these frequencies is beyond the acceptable error margin, then the steps designated by Blocks 12, 14 and 10 may then be performed again until it is determined that the FBARs are successfully tuned. Thereafter, the wafer 20 may be cut into chips (Block 18).

It should be noted that this description is intended to be exemplary in nature and not limiting to the scope of the invention. By example, the method described above may be performed on a single FBAR which is located on a portion of an already-cut wafer. For this case, no calculation needs to be performed to obtain an average series resonant frequency, and the steps may be performed simply based upon a measurement of the series (or parallel) resonant frequency yielded by the single FBAR. Also by example, the method may be performed by measuring and tuning the parallel resonant frequencies of a selected number of FBARs instead of by measuring and tuning the series resonant frequencies of these devices. Also, the etching of the top electrode may be performed using chlorine plasma instead of F plasma, or by using any suitable material removal method depending on the nature of the material that forms the top electrode. Moreover, the FBARs illustrated in FIGS. 2, 3a, 3b, and 4, and those shown in FIGS. 6a and 6b, which will be described below, are intended to be exemplary in nature, and it is to be understood that the method of the invention may be performed on any other types of FBAR structures. By example, the method can be performed to an FBAR having a top electrode 28 comprised of tungsten (W) or tantalum (Ta) instead of Molybdenum (Mo), or the structure of the FBAR layers may be different.

The thinning of the top electrodes of the FBARs increases the respective series resistances of the FBARs. By example, prior to the etching of the top electrode of an individual FBAR, the FBAR has an internal loss resistance of 0.5 Ω or less. Also, for a case in which the top electrode is comprised of Mo and has a thickness of 300 nm, the top electrode's sheet resistance is 0.41 Ω. As such, the total series resistance of the FBAR (top and bottom electrodes of a given area) is 2.1 Ω. The removal of 80 nm from the top electrode increases the total series resistance of the FBAR to 2.4 Ω and decreases the Q value of the FBAR by 12%. For cases in which it is known that such a series resistance would have a negative effect upon a particular application, the FBARs may be designed to have top electrodes with thicknesses of 400 nm and ZnO layers with thicknesses that are correspondingly thinner.

In an exemplary case wherein the method described above is employed to tune FBARs of a plurality of wafers, it is assumed that there is a 3% standard deviation in the series resonant frequencies exhibited by the FBARs of the plurality of wafers. By designing the FBARs so that they yield resonant frequencies that are 4.5% below the target resonant frequency, 99.7% of the wafers can be tuned successfully.

Figure 6A:
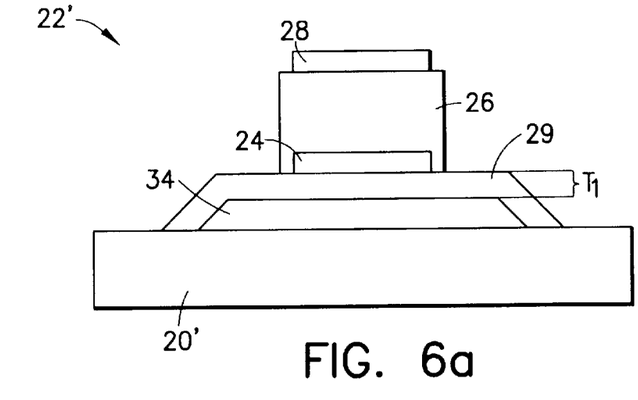
FIG. 6a illustrates a cross-section of an exemplary FBAR constructed on a wafer, showing a membrane layer having a thickness of T1.
Figure 6B:
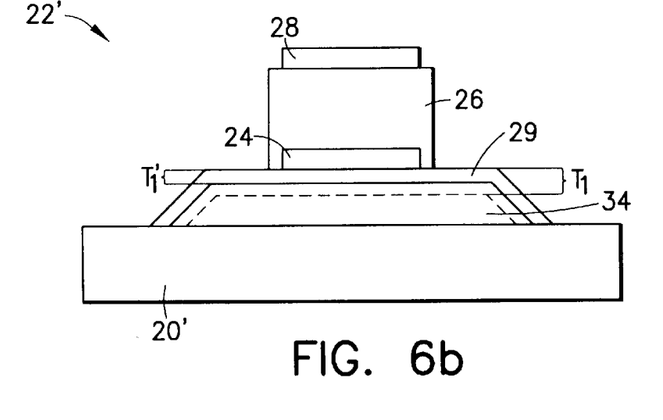
FIG. 6b illustrates the FBAR and wafer of FIG. 6a after having undergone the method of FIG. 1.

In accordance with the invention, the method may also be performed by reducing another layer of the individual FBARs instead of by reducing the top electrode. More particularly, after the performance of the steps designated by Blocks 10 and 11, the step of Block 12 may be performed to another one of the FBAR layers having a thickness and a material influencing the frequencies at which the FBARs exhibited resonances. By example, FIG. 6a illustrates an exemplary FBAR 22' comprising a substrate 20, an air gap 34, a membrane 29 formed of silicon dioxide ($SiO_2$), a piezoelectric layer 26, and top and bottom electrodes 28 and 24, respectively. Membranes formed within FBARs are known to have thicknesses which influence the frequencies at which the FBARs exhibited resonances. As such, based upon a known relationship between various membrane thicknesses and FBAR resonant frequencies, the FBAR 22' can be tuned by altering (e.g., reducing) the thickness T1 of the membrane 29. The alteration of the membrane's thickness may be performed via any suitable technique such as, for example, a photolithographic technique. For example, the membrane 29 can be gas phase etched through the air gap 34. After the membrane thickness has been altered as such, the steps designated by Blocks 10, 11, and 18 may then be performed. FIG. 6b illustrates the FBAR 22' after the thickness T1 of membrane 29 has been reduced to a thickness of T1'.

Further in accordance with the invention, each FBAR may be tuned by adding material to a portion (e.g., the top electrode) of the FBAR. In an exemplary case, similar to that described above for the single wafer application, it is assumed that the performance of the steps designated by Blocks 10, 11, and 12 results in a calculated average series resonant frequency which corresponds, according to the relationship shown in FIG. 5, to a top electrode thickness of 250 nm. In this event, it can be concluded based on the graph of FIG. 5 that 50 nm of material needs to be added to the top electrode in order to tune the series resonant frequency to a target series resonant frequency of 954.6 MHz. As such, 50 nm of material (e.g., Mo) can then be deposited via, by example, vacuum deposition, over the top electrode (Block 14), and the remaining steps of the method may be performed until the FBAR is successfully tuned. A suitable mask is first provided so that deposition occurs only at the desired locations.

It should be noted that the addition of a layer of metal may cause the top and bottom electrodes to become short-circuited to one another. In this event, a portion of the added layer needs to be removed to eliminate the short-circuit. This may be accomplished by, for example, employing a photolithographic technique to remove the layer portion causing the short-circuit. For cases in which the FBARs comprise bridge structures, however, an easier technique such as, by example, laser cutting, may be performed to remove the layer portion.

Figure 8:
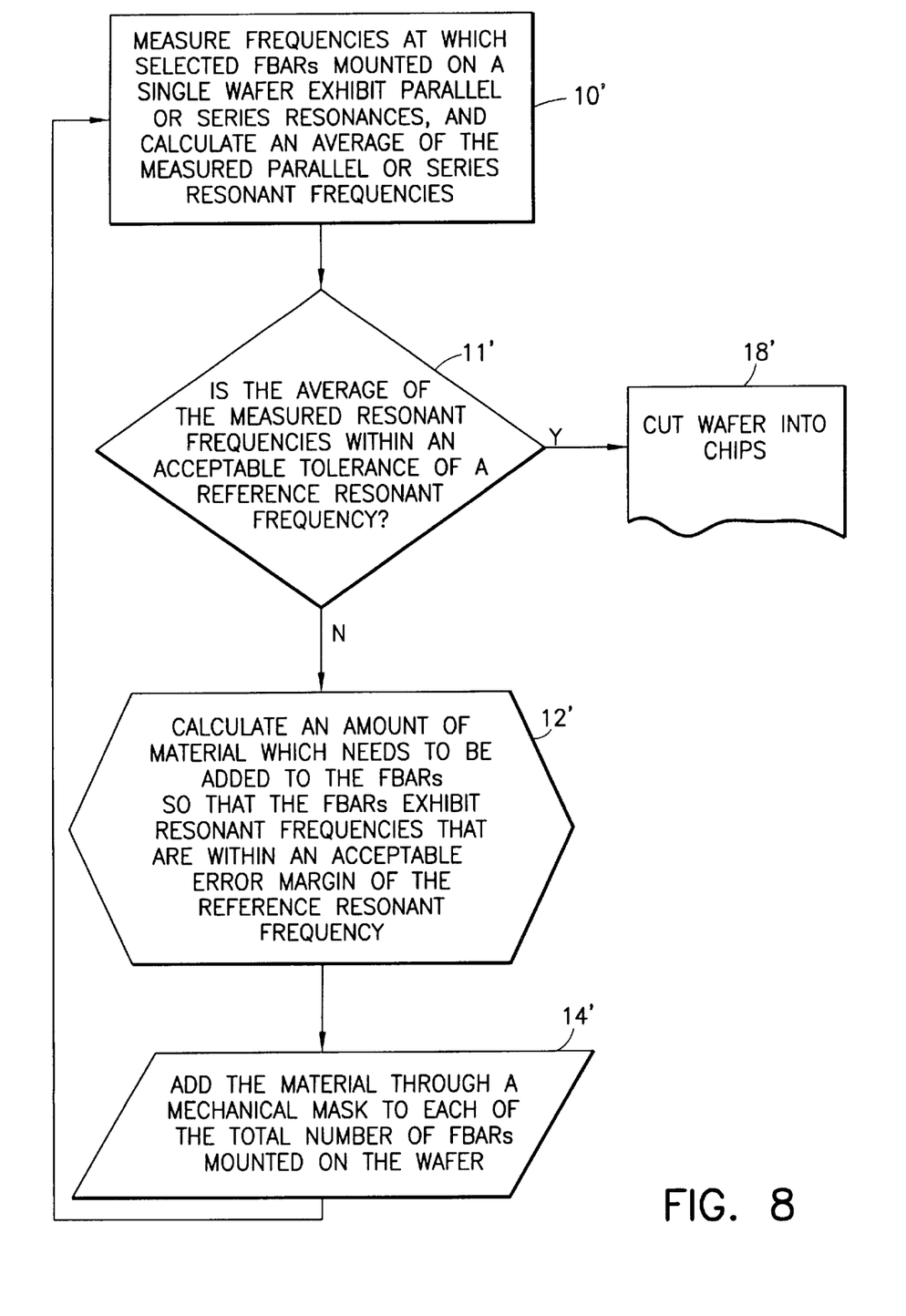
FIG. 8 illustrates a flow diagram of a method performed in accordance with the invention for tuning at least one of a series resonant frequency and a parallel resonant frequency exhibited by FBARs, wherein such tuning is achieved by adding a dielectric material to selected portions of the FBARs.

According to another aspect of the invention, the tuning may be accomplished by the addition of a layer of a dielectric material to a portion of the respective FBARs. FIG. 8 shows a flow diagram of the steps performed in accordance with this aspect of the invention. The steps designated by the Blocks 10', 11', and 18' are performed in a similar manner as the steps designated by the Blocks 10, 11, and 18, respectively, of FIG. 1. In an exemplary case, similar to that described above for the single wafer application, it is assumed that the performance of the steps designated by Blocks 10' and 11' results in a calculated average series resonant frequency of 994.28 MHz. This frequency may result owing to, by example, FBARs being fabricated which have layers of thicknesses that are 4% thinner than design thicknesses.

After the steps designated by Blocks 10' and 11' are performed, a step designated by Block 12' is performed. This step may be understood in view of FIG. 10, which illustrates a graph showing the manner in which the series resonant frequencies exhibited by an FBAR are related to various thicknesses of an added layer of dielectric material that is formed of, by example only, zinc-oxide (ZnO). As can be seen from the graph, the inverse of each particular series resonant frequency is a function of a corresponding thickness of the added layer of ZnO.

Figure 10:
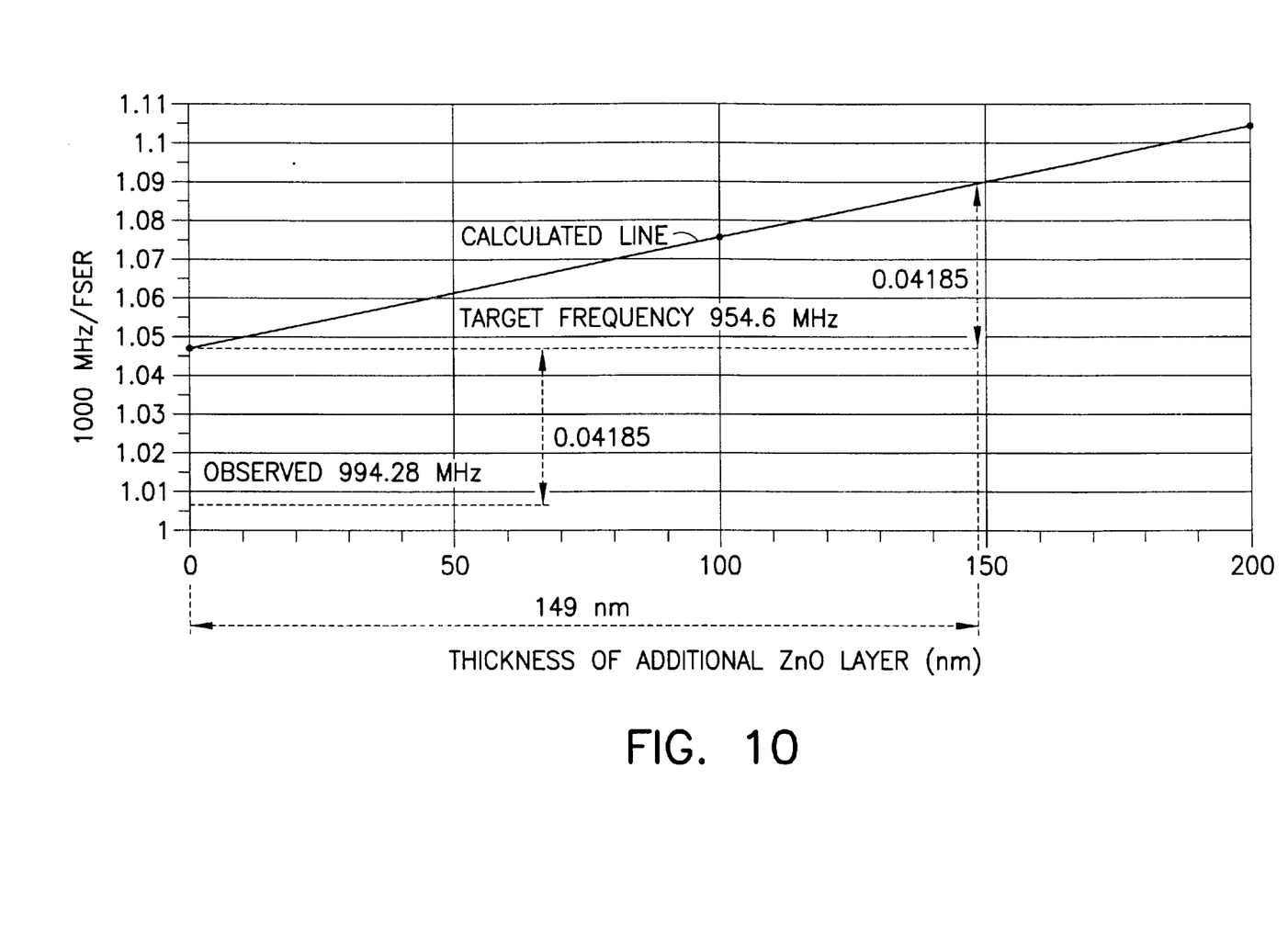
FIG. 10 illustrates a graph showing the manner in which the series resonant frequencies exhibited by an FBAR are related to various thicknesses of an added layer of dielectric material that is formed of zinc-oxide (ZnO).

In view of FIG. 10, it can be seen that for this exemplary case, the inverse of the calculated average series resonant (e.g., 994.28 MHz) needs to be increased by 0.04185/GHz in order to reach the inverse of the target frequency (e.g., 954.6 MHz). It can also be appreciated that a layer having a thickness of 149 nm needs to be formed over a selected portion of the FBAR in order to achieve this result and to tune the series resonant frequency to a target series resonant frequency of 954.6 MHz.

Figure 9:
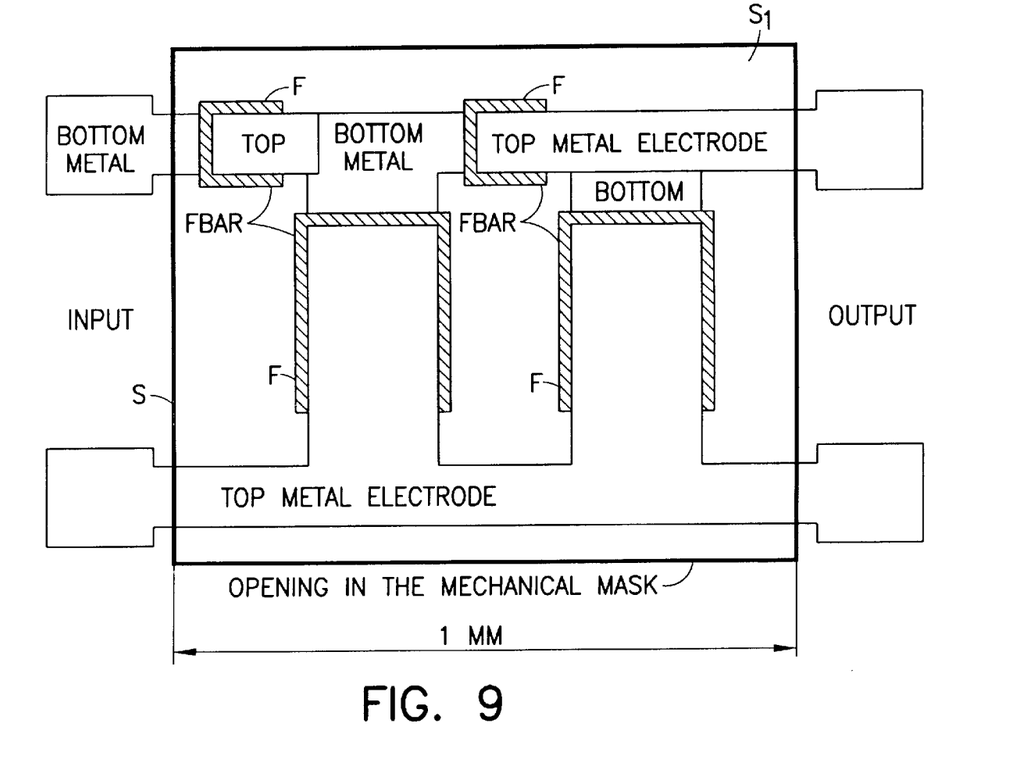
FIG. 9 illustrates an example of a step of the method of FIG. 8, wherein the dielectric material is deposited through a mechanical mask opening over the selected portions of the FBARs.

After the step of Block 12' is performed, the material is then be deposited over selected portions of the FBAR (Block 14'), thereby forming an "added" layer having a thicknesses of about 149 nm. The deposition of the material is preferably performed using a mechanical mask. By example, FIG. 9 shows a representation of an opening (surrounded by the square (S)) in a mechanical mask. The opening has a length that is, by example, about 1 mm long. Through the mask opening, the appropriate amount of dielectric material is deposited over selected portions of various FBARs (F) (shown as part of an exemplary ladder filter) formed on a substrate S1. The mechanical mask may comprise any suitable material, and may be formed by, for example, anisotropic etching of a (100) silicon wafer After the step designated by Block 12' is performed, the remaining steps of the method may be performed until successful tuning of the FBAR is achieved. An actual calculation performed assuming an addition of a ZnO layer having a thickness of 149 nm resulted in a resonant frequency of 954.4 MHz, which is 0.02% below the target frequency.

After the dielectric material is deposited over the FBARs, portions of the material may cover contact pads of the electrodes. In this event, these portions of the deposited material are removed in order to allow wires to be bonded to the contact pads. This may be accomplished using a photolithographic or laser cutting technique as described above.

It should be noted that the exemplary case described above is not intended to limit the scope of the invention, and that other suitable materials and other means may be employed to carry out the method. By example, the step designated by Block 12' may be performed by any suitable means such as, for example, a computer program. Also, it should be noted that any suitable dielectric material may be used in lieu of ZnO to be added to the FBARs. However, the use of ZnO to form the added layer is preferred in cases wherein the FBAR piezoelectric layers are also formed of ZnO since the sputtering of both these layers may be performed easily.

While the invention has been particularly shown and described with respect to preferred embodiments thereof, it will be understood by those skilled in the art that changes in form and details may be made therein without departing from the scope and spirit of the invention.

What is claimed is:

1. A method for tuning individual ones of a plurality of Thin Film Bulk Acoustic Wave Resonators (FBARs) constructed on a wafer, each of the FBARs exhibiting at least one of a series resonance and a parallel resonance at respective frequencies before a layer is deposited over the FBAR, wherein after the layer is formed over at least a portion of the individual FBARs, the FBARs exhibit at least one of a series resonance and a parallel resonance at frequencies that are a function of a thickness of the layer, comprising the steps of:

measuring frequencies at which selected ones of the FBARs exhibit one of a series resonance and a parallel resonance before the layer is formed over the FBARs;

calculating an average of the measured frequencies;

calculating a thickness (T) of the layer that is to be formed over at least a portion of the FBARs in order to minimize a difference between the calculated average of the measured frequencies and a reference frequency; and simultaneously forming the layer over at least a portion of each of the plurality of FBARs so that the layer has the thickness (T), thereby minimizing the difference between the reference frequency and the calculated average of the measured frequencies.

2. A method as set forth in claim 1, wherein the layer is formed of a dielectric material.

3. A method as set forth in claim 1, wherein the layer is formed of zinc-oxide (ZnO).

4. A method as set forth in claim 1, wherein the step of forming is performed using a mechanical mask.

5. A method as set forth in claim 1, wherein the step of simultaneously forming is performed by sputtering the layer over each of the plurality of FBARs.

6. A method as set forth in claim 14, wherein the number of selected ones is less than a total number of the plurality of FBARs constructed on the wafer.

7. A method for simultaneously tuning a plurality of Thin Film Bulk Acoustic Wave Resonators (FBARs) before the FBARs are separated from a wafer, comprising steps of:

(i) measuring frequencies at which selected ones of the FBARs exhibit a resonance, the frequencies being a function of thicknesses of the selected ones of the FBARs;

(ii) calculating an average of the measured frequencies;

(iii) calculating a thickness for at least one layer which, after being deposited on the FBARs, will cause a difference between the calculated average of the measured frequencies and a reference frequency to be substantially minimized; and (iv) simultaneously forming the at least one layer having the thickness calculated in step (iii) on the plurality of FBARs before the FBARs are separated from the wafer, thereby causing the difference between the reference frequency and the calculated average of the measured frequencies to be substantially minimized.

8. A method as set forth in claim 7, wherein the layer formed in step (iv) comprises a dielectric material.

9. A method as set forth in claim 7, wherein the number of selected ones is less than a total number of the plurality of FBARs fabricated on the wafer.

10. A method for simultaneously tuning a plurality of Thin Film Bulk Acoustic Wave Resonators (FBARs) before the FBARs are separated from a wafer, comprising steps of:

measuring a frequency at which selected ones of the FBARs exhibit a resonance, the frequency being a function of thicknesses of the selected FBARS;

calculating an average of the measured frequencies;

calculating an amount (A) by which the thicknesses of the selected FBARs need to be altered in order to substantially minimize a difference between the calculated average of the measured frequencies and a reference frequency; and simultaneously altering the thicknesses of each of the plurality of the FBARs by the amount (A) before the plurality of FBARs are separated from the wafer for reducing the difference between the reference frequency and the calculated average of the measured frequencies.

11. A method as set forth in claim 10, wherein the number of selected ones is less than a total number of the plurality of FBARs fabricated on the wafer.

* * * * *

UNITED STATES PATENT AND TRADEMARK OFFICE
CERTIFICATE OF CORRECTION

PATENT NO. : 6,051,907
DATED : 4/18/00
INVENTOR(S) : Markku Antero Ylilammi

It is certified that error appears in the above-identified patent and that said Letters Patent is hereby corrected as shown below:

Col. 10, line 13, Claim 6, "14" should read --1--.

Signed and Sealed this

Twentieth Day of February, 2001

Attest:

NICHOLAS P. GODICI

Attesting Officer

Acting Director of the United States Patent and Trademark Office